United States Patent [19]

Ponto et al.

[11] 4,359,600
[45] Nov. 16, 1982

[54] PROGRAMABLE LOW IMPEDANCE DIGITAL ATTENUATORS

[76] Inventors: Robert Ponto, 9814 Dawson Hill Rd.; Hardison G. Martin, 3700 Wilderness Trail, both of Louisville, Ky. 40299

[21] Appl. No.: 91,330

[22] Filed: Nov. 26, 1979

[51] Int. Cl.³ .................. H04H 1/02; H04R 1/02
[52] U.S. Cl. ........................... 179/1 B; 179/1 VL
[58] Field of Search .................. 179/1 B, 1 AT, 1 A, 179/1 R, 1 D, 1 VL, 1 CN; 333/81 R; 340/146.2

[56] References Cited

U.S. PATENT DOCUMENTS 4,053,870 10/1977 Noe .................................... 333/81 R

Primary Examiner—Joseph A. Popek
Attorney, Agent, or Firm—Edward M. Steutermann

[57] ABSTRACT

A low impedance digital attenuator to selectively attenuate an alternating current composite program signal composed of output program signals from different input channels in accordance with the number of active input signals where each input channel includes an input channel control device to provide an actuating signal when the channel is in selected operating mode and a program output signal. The actuating signals of the channels are summed and converted to a digital signal. The digital signal is supplied to a converter to generate a digital control signal where the relationship between the digital signal and the digital control signal is nonlinear. First and second digital to analog converters are provided to receive the digital control signal and a reference signal. The first digital to analog converter attenuates the composite program signal as a function of the digital control signal and provides an attenuated composite program signal. The second digital to analog converter receives a reference signal and provides a second output composite program. An amplifier having a selected gain is provided to receive the first and second outputs to provide an attenuated program signal.

4 Claims, 3 Drawing Figures

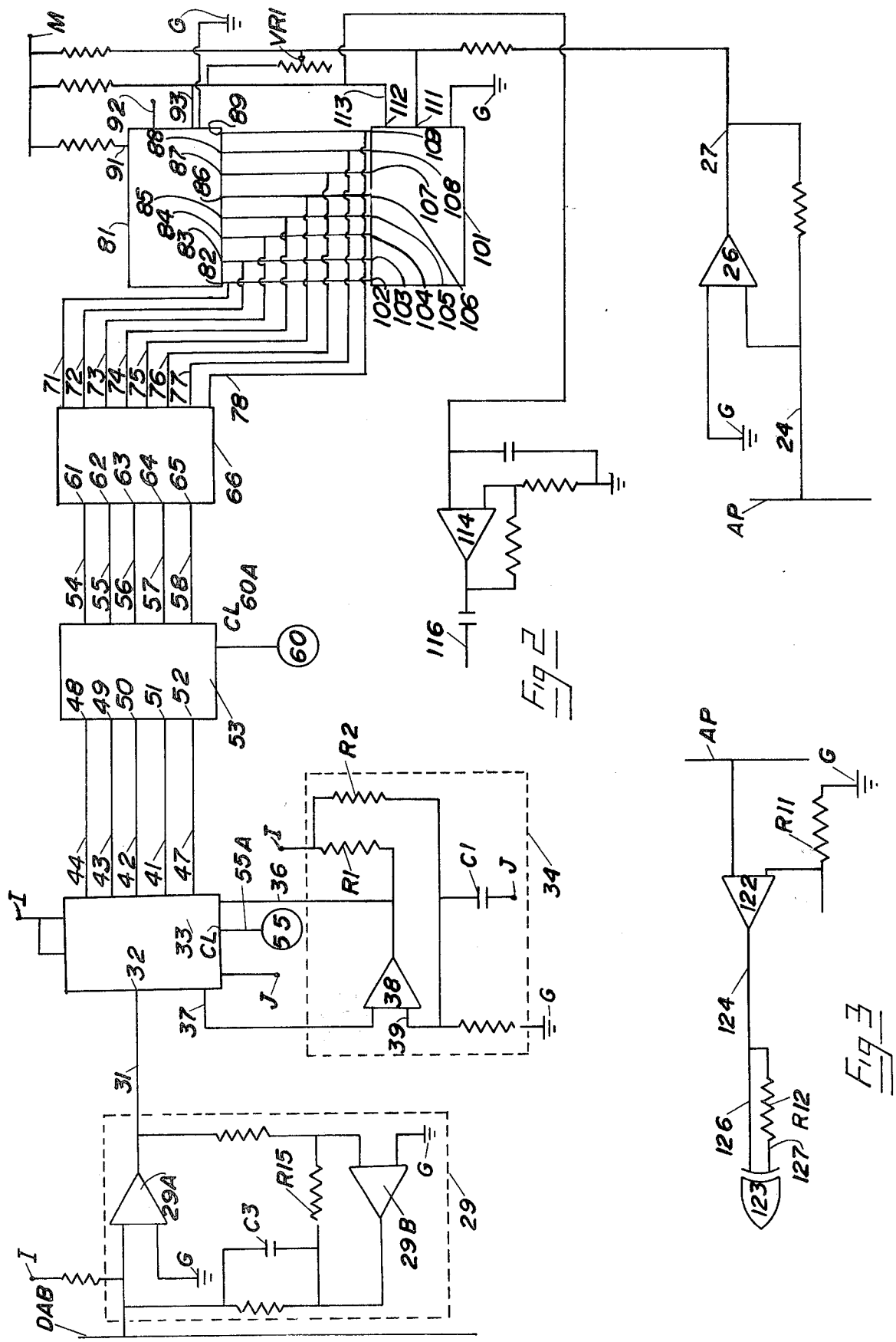

PROGRAMABLE LOW IMPEDANCE DIGITAL ATTENUATORS

BACKGROUND OF THE INVENTION

The present invention relates to systems to attenuate a selected electrical signal in response to changes in selected conditions including changes in characteristics of the signal. Signal attenuation means are utilized in numerous applications from highly sophisticated applications such as computers to more straightforeward applications in simple electrical or electromechanical devices.

Signal attenuation can, of course, be accomplished manually by observation of the situation to be controlled and manual manipulation of the signal control means. In the alternative, signal attenuation can be accomplished by sensing devices responsive to the condition to be controlled and use of controlled devices to automatically attenuate signals in response to changed conditions.

In one application of the foregoing, specifically in electronic circuitry, attenuation can be accomplished by the use of amplifier means for the controlled signal with continuous feedback and gain adjustment of the amplifier circuit. Such arrangements provide satisfactory control in some instances but in other application, for example in attenuation of the output of multiple input sound actuated sound amplification systems, such arrangements have been less satisfactory than desired. Also, such systems are subject to distortion resulting from transient and feedback effects.

Other attenuation methods have provided for stepwise, rather than continuous attenuation. Such arrangements have generally been manually controlled and where automatic control has been provided as disclosed in an article entitled "Automatic Attenuator Rapidly Changes Signal Level", Electronics, Sept. 15, 1969 at page 120 by continuous monitoring of incoming signals to shift attenuation levels. Such systems have been found less than desirable in sound amplification because the rapid switching of output channels leads to undesirable interference with the quality of transmitted program material.

In some sound attenuation devices so called voltage controlled amplifiers have been utilized wherein the attenuation or amplification of a program signal is accomplished by varying the voltage to the gain control of the amplifier to modify the attenuator to maintain selected output signal characteristics. However, such voltage controlled amplifiers have inherently poor noise factors and tend to distort the program to be amplified.

SUMMARY OF THE INVENTION

The present invention provides a signal attenuator arrangement for use with multiple signal inputs where the program signal is stepwise attenuated as a function of control signals received by the attenuator from control signal generator source means.

The attenuated signal can be another control signal or can, for example be an output signal to an audio amplifier where the control signals can be generated as a function of the number of active microphones in a multiple input sound actuated sound amplification system.

In devices within the scope of the present invention multiple inputs are available and are summed to provide a composite program signal. Also, the individual programs are converted to direct current signals and the direct current signals are summed to provide a direct current control signal. The control signal is utilized to provide a characteristic digital signal indicative of the number of actuated inputs and is then selectively modified to provide a second digital signal to provide selected attenuation characteristics where the second signal is supplied to each of two digital to analog converters which also accept the program signal and provide a balanced output where there is no gain and insignificant inpedance in the analog to digital converters so the program signal current is attenuated.

More particularly, the present invention provides a low impedance digital attenuator to selectively amplify a composite program signal composed of output signals from a multiplicity of inputs in accordance with the number of input signals where each input channel provides input channel control means to provide first actuating signal when the input channel is in selected operating mode and providing a program signal; summing means to sum the first actuating input signals to provide a summed actuating signal, analog to digital signal converter means to receive the summed actuating input signals and provide a digital output signal as a function of the voltage of the summed actuating input signals, converter means to receive the digital output signal and provide a selected digital control signal in response to the digital output signal where the relationship between the digital output signal and the digital control signal is nonlinear; direct current driven first and second digital analog converter means both adapted to receive the control digital signal and reference signal input means where the first digital to analog converter means is adapted to receive and attenuate the composite program signal as a function of the control digital signal and where the first digital to analog converter means has a first output to provide the attenuated composite program signal and a first superposed direct current signal as a function of the digital control signal and wherein the second digital to analog converter means has a second output where the first and second outputs provide signals of equal but inverse polarity as a function of the control digital signal so the composite program signal received at the reference signal input means of the first digital to analog converter means is attenuated at the first digital to analog converter output and the supressed direct current signal is balanced by a similar dc signal from the output of the second digital to analog converter; and composite program amplifier means having a selected gain with input means connected to program output of the first output means whereby the composite program is attenuated with essentially no impedance.

One example of an arrangement within the scope of the present invention is described hereinafter with respect to the accompanying illustrations and it will be recognized that other applications and modification within the scope of the present invention will become obvious to those skilled in the art upon reading the following disclosure.

BRIEF DESCRIPTION OF THE DRAWINGS

One example in accordance with the present invention is illustrated in the figures wherein:

FIG. 2 is an outline schematic illustration of a digital attenuator circuit within the scope of the present invention;

FIG. 3 is a schematic illustration of an example of an "O" crossing detector for use in the arrangement shown in FIG. 2.

Figure 1:
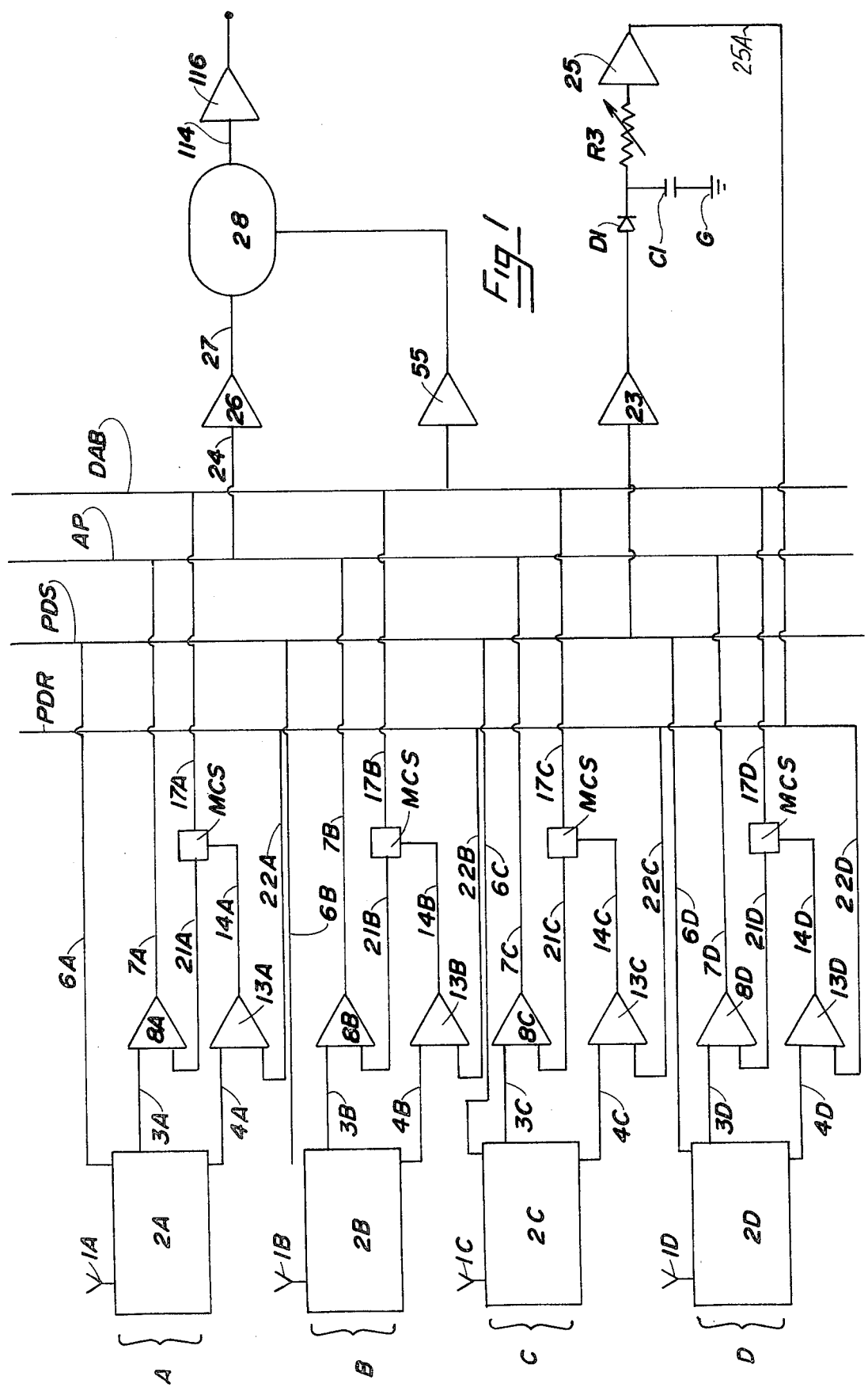
FIG. 1 is a schematic illustration of a multiple input sound system utilizing an attenuator within the scope of the present invention.

Referring first to FIG. 1 which is a schematic illustration of one application of a digital attenuator within the scope of the present invention in a sound mixing and transmitting circuit.

Specifically, the circuit shown in FIG. 1 provides four program input means, for microphones 1A–1D where each microphone provides program signal to an associated input channels 2A–2D all as shown in our copending application U.S. Pat. No. 4,239,938. As described in our aforenoted application, each input channel provides an output 3A–3D for the program signal to an amplifier switch 8 actuated as hereinafter described to supply the program to an audio program buss AP.

A second output 4A–4D of each input channel 2A–2D is provided to supply a rectified and filtered direct current signal characteristic of the input signal to a comparator 13 as described in out above referenced copending application where comparator 13 provides a binary actuating signal to a master control switch MCS which actuates amplifier switch 8 by means of control switch MCS output 21 so that the program is transmitted to audio program buss AP.

As shown, input channels 2A–2D also provide an output 6A–6D from each input channel to supply direct current rectified and filtered signal to a buss PDS where the signals from each input channel are summed then attenuated through a summing amplifier 23 with its output in series through diode D1 and capacitance resistor filter C1 R1 to a driver 25, for example a National TM LM324 which provides a reference signal at output 25A reflective of the sum of the rectified and filtered program input signals. The output 25A of driver 25 is supplied to buss PDR to provide input 22 reference to comparators 13 of each input channel. When the relationship between the reference signal and input 4A–4D is within a preselected parameter comparator 13 provides an actuating signal for master control switch MCS.

Master control switch MCS further provides actuating input signals at output 17 when the Master control switch is actuated so that a program is being transmitted. In the example shown the signal at output 17 of each master control switch is digital but other signals could be provided in other applications.

The signals at the outputs 17 A–D of each master control switch MCS are summed on buss DAB so that where as in the example shown, digital signals are provided to buss DAB the summed actuating input signals on buss DAB is provided by stepwise additions and elimination of the digital signals from each master control switch MCS so the instantaneous characteristics of the signal on buss DAB is indicative of the number of active channels but not necessarily the strength of the program signals.

Likewise the amplified program signal is provided from output of switches 8 of actuated input channels to a summing buss AP. The summed program signal from buss AP is supplied as shown in FIG. 1 through output 27 of a preamplifier 26 to a digital attenuator 28 in accordance with the present invention, as shown in FIGS. 2 and 3 and described hereinafter, wherein the summed actuating input signals from buss DAB is first supplied to a noninverting buffer 29 which acts as an emitter follower to isolate the summing buss AP from the components following, including a pair of operational amplifiers 29A and 29B for example National Semiconductor parts LM 324N with associated elements, as known in the art, powered by a bias resistor RI for example +8 vdc to establish ½ the least significant bit signal 31 to the analog input 32 of an analog to digital signal converter 33 (A/D converter 33) for example a National Semiconductor ADC800. A/D converter 33 is provided within the scope of the present invention to provide a digital output reflective of the instantaneous voltage of the signal received at input 32. The digital output signal described hereinafter is useful as an indication of the number of active input channels.

A/D converter 33 of the type which requires a power up turn on 34 to ensure startup having one lead 36 connected to the start conversion input of converter 33 and another lead 37 connected to the end of conversion terminal of A/D converter 33 and to the noninverting input 37 of a comparator 38 where the inverting input 39 is grounded at G, where lead 36 is provided from the output of comparator 38 and pullup I through resistor R1 and where feedback is provided from pullup I to input 39 by means of a filter circuit including resistor R2 and capacitor C1 from negative pullup, for example 8 vdc. A/D converter 33 is activated by a clock 55 supplying signals to CL input.

A/D converter 33 is selected to provide a selected generally linear digital response to the signal received at input 32 and in the example shown the characteristics of A/D converter 33 can be selected as follows in Table I to provide the binary signals at outputs 41–44 and 47 of A/D converter 33 in response to the input. It will be noted that Table I further provides the objective attenuation desired throughout the system as described hereinafter but it will be recognized that within the scope of the present invention other attenuation objectives can be achieved.

TABLE #1

| NO OF ACTIVE INPUT CHANNELS | CHARACTERISTICS OF A/D CONVERTER | | | | | | | DECIMAL BASE EQUIVALENT |
|---|---|---|---|---|---|---|---|---|
| | INPUT VOLTAGE | ATTENUATION DESIRED | BINARY SIGNAL AT PIN | | | | | |
| | | | 44 | 43 | 42 | 41 | 47 | |
| 0 | .125 | 24 | 1 | 1 | 1 | 1 | 1 | 31 |
| 1 | .375 | 0 | 1 | 1 | 1 | 1 | 0 | 30 |
| 2 | .625 | 3 | 1 | 1 | 1 | 0 | 1 | 29 |
| 3 | .875 | 4.82 | 1 | 1 | 1 | 0 | 0 | 28 |
| 4 | 1.125 | 6 | 1 | 1 | 0 | 1 | 1 | 27 |
| 5 | 1.375 | 7 | 1 | 1 | 0 | 1 | 0 | 26 |
| 6 | 1.635 | 7.8 | 1 | 1 | 0 | 0 | 1 | 25 |
| 7 | 1.875 | 8.4 | 1 | 1 | 0 | 0 | 0 | 24 |
| 8 | 2.125 | 9 | 1 | 0 | 1 | 1 | 1 | 23 |
| 9 | 2.375 | 9.5 | 1 | 0 | 1 | 1 | 0 | 22 |

TABLE #1-continued

| NO OF ACTIVE INPUT CHANNELS | INPUT VOLTAGE | ATTENUATION DESIRED | BINARY SIGNAL AT PIN | | | | | DECIMAL BASE EQUIVALENT |
|---|---|---|---|---|---|---|---|---|
| | | | 44 | 43 | 42 | 41 | 47 | |
| 10 | 2.625 | 10 | 1 | 0 | 1 | 0 | 1 | 21 |
| 11 | 2.875 | 10.4 | 1 | 0 | 1 | 0 | 0 | 20 |
| 12 | 3.125 | 10.8 | 1 | 0 | 0 | 1 | 1 | 19 |
| 13 | 3.375 | 11.1 | 1 | 0 | 0 | 1 | 0 | 18 |
| 14 | 3.625 | 11.5 | 1 | 0 | 0 | 0 | 1 | 17 |
| 15 | 3.875 | 11.8 | 1 | 0 | 0 | 0 | 0 | 16 |
| 16 | 4.125 | 12 | 0 | 1 | 1 | 1 | 1 | 15 |
| 17 | 4.375 | 12.3 | 0 | 1 | 1 | 1 | 0 | 14 |
| 18 | 4.625 | 12.5 | 0 | 1 | 1 | 0 | 1 | 13 |
| 19 | 4.875 | 12.9 | 0 | 1 | 1 | 0 | 0 | 12 |
| 20 | 5.125 | 13 | 0 | 1 | 0 | 1 | 1 | 11 |
| 21 | 5.375 | 13.3 | 0 | 1 | 0 | 1 | 0 | 10 |
| 22 | 5.675 | 13.5 | 0 | 1 | 0 | 0 | 1 | 9 |
| 23 | 5.875 | 13.6 | 0 | 1 | 0 | 0 | 0 | 8 |
| 24 | 6.125 | 13.8 | 0 | 0 | 1 | 1 | 1 | 7 |
| 32 | 8.125 | 15 | 0 | 0 | 0 | 0 | 0 | 0 |
| 64 | | 18 | | | | | | |

Binary output signals 41–44 and 47 of A/D converter 33 are supplied to inputs 48–52 of a latch 53, for example a Motorola MC14174B hex type D flip flop which is periodically clocked for example by a "O" crossing detector 60 as shown in FIG. 3 and described hereinafter to transfer the current digital input from terminals 48–52 to outputs 54–58 on each clock pulse at input 55A and to inputs 61–65 of a programmable processing unit 66 for example a Signetics (TM) 32×8 Prom 82S23 which can be programmed as known in the art to provide selected in this case, 8 bit binary output at terminals 71–78 which output is determined by the input. In the present invention processing unit 66 can be programmed to provide any selected nonlinear relationship between the input and the output. Typically the unit is programmed to provide a logarithmic relationship as shown in Table #2 so that the gain is equal to $1/\sqrt{n}$ where n=the number of active inputs. The output from processing unit 66 is utilized as an attenuation control signal for attenuation in a pair of digital to analog converters (D/A converters) 81 and 101.

TABLE #2

EXAMPLE OF BINARY OUTPUT FROM PROM

| NO. OF ACTIVE INPUT CHANNELS | BINARY OUTPUT SIGNAL AT PIN | | | | | | | | DECIMAL NO. | GAIN $1/\sqrt{N}$ |
|---|---|---|---|---|---|---|---|---|---|---|
| | 71 | 72 | 73 | 74 | 75 | 76 | 77 | 78 | | |
| 0 | 0 | 0 | 0 | 0 | 1 | 1 | 1 | 1 | 15 | .059 *0 |
| 1 | 1 | 1 | 1 | 1 | 1 | 1 | 1 | 1 | 255 | 1 |
| 2 | 1 | 0 | 1 | 1 | 0 | 1 | 0 | 0 | 180 | .707 |
| 3 | 1 | 0 | 0 | 1 | 0 | 0 | 1 | 1 | 147 | .578 |
| 4 | 0 | 0 | 0 | 0 | 0 | 0 | 0 | 0 | 128 | .5 |
| 5 | 0 | 1 | 1 | 1 | 0 | 0 | 1 | 0 | 114 | .447 |
| 6 | 0 | 1 | 1 | 0 | 1 | 0 | 0 | 0 | 104 | .408 |
| 7 | 0 | 1 | 1 | 0 | 0 | 0 | 0 | 0 | 96 | .378 |
| 8 | 0 | 1 | 0 | 1 | 1 | 0 | 1 | 0 | 90 | .354 |
| 9 | 0 | 1 | 0 | 1 | 0 | 1 | 0 | 1 | 85 | .333 |
| 10 | 0 | 1 | 0 | 1 | 0 | 0 | 0 | 1 | 81 | .316 |
| 11 | 0 | 1 | 0 | 0 | 1 | 1 | 0 | 1 | 77 | .3015 |
| 12 | 0 | 1 | 0 | 0 | 1 | 0 | 0 | 1 | 73 | .289 |
| 13 | 0 | 1 | 0 | 0 | 0 | 1 | 1 | 1 | 71 | .278 |
| 14 | 0 | 1 | 0 | 0 | 0 | 1 | 0 | 0 | 68 | .267 |
| 15 | 0 | 1 | 0 | 0 | 0 | 0 | 1 | 0 | 66 | .258 |
| 16 | 0 | 1 | 0 | 0 | 0 | 0 | 0 | 0 | 64 | .25 |
| 17 | 0 | 0 | 1 | 1 | 1 | 1 | 1 | 0 | 62 | .243 |
| 18 | 0 | 0 | 1 | 1 | 1 | 1 | 0 | 1 | 61 | .236 |
| 19 | 0 | 0 | 1 | 1 | 1 | 0 | 1 | 1 | 59 | .23 |
| 20 | 0 | 0 | 1 | 1 | 1 | 0 | 0 | 1 | 57 | .224 |
| 21 | 0 | 0 | 1 | 1 | 0 | 1 | 1 | 1 | 55 | .218 |
| 22 | 0 | 0 | 1 | 1 | 0 | 1 | 1 | 0 | 54 | .213 |
| 23 | 0 | 0 | 1 | 1 | 0 | 1 | 0 | 1 | 53 | .209 |

TABLE #2-continued

EXAMPLE OF BINARY OUTPUT FROM PROM

| NO. OF ACTIVE INPUT CHANNELS | BINARY OUTPUT SIGNAL AT PIN | | | | | | | | DECIMAL NO. | GAIN $1/\sqrt{N}$ |
|---|---|---|---|---|---|---|---|---|---|---|
| | 71 | 72 | 73 | 74 | 75 | 76 | 77 | 78 | | |
| 24 | 0 | 0 | 1 | 1 | 0 | 1 | 0 | 0 | 52 | .204 |
| 32 | 0 | 0 | 1 | 0 | 1 | 1 | 0 | 1 | 45 | .149 |
| 64 | 0 | 0 | 0 | 0 | 1 | 1 | 1 | 1 | 31 | .125 |

Thus it can be seen that the processing unit can be programmed to provide control signal for expansion or contraction of a program signal and in the arrangement shown provides an arrangement where the gain is 1 for one active channel and diminishes as a log function with additional input channel actuation.

As shown in FIG. 2, in accordance with one feature of the present invention the outputs 71–78 are supplied to the inputs 82–89 of two digital to analog (D/A) converters 81, 101 for example 8 bit high speed current output D/A converter Part No. DAC0800 by National Semiconductor (TM).

D/A converters 81, 101 of the type shown in FIG. 2 are commonly utilized for processing a fixed dc reference signal in accordance with binary input by dc voltage enhancement of the reference signal. In the present application it has been found, unexpectedly, that a pair of D/A converters which are relatively inexpensive can be utilized for attenuation of the alternating current program signal.

D/A converters 81,101 as shown in FIG. 2 are normally utilized to multiply a fixed reference signal applied, for example at input 91 of converter 81 to provide an output analog signal at output 92 which is a function of the digital signal and an inverse signal at output 93.

In the application within the scope of the present invention shown in FIG. 2 D/A converter 101 is connected to receive the composite alternating current program signal 3A from buss AP where signal 24 is supplied through a pre amp 26 and and output 76 is supplied to the reference input terminal 111 of D/A converter 101.

The program input at terminal 111 is processed through D/A converter 101 in accordance with the control signals supplied to terminals 102–109 of processing unit 101 and the output signal is provided at output 112. In D/A converter 101 the signal received at input 111 is attenuated in accordance with the program shown in Table #2 and applied to inputs 102-109 so as previously discussed the characteristic dc voltage of the D/A converter is also imposed on the output program. The imposed dc signal is balanced and effectively removed by connecting output 112 to inverse output 92 of D/A converter 81 where D/A converter 81 receives the output signal from processing unit 66 at inputs 82-89 so that the inverse dc signal at output 99 balances the dc portion of the signal at output 112 and a clear, attenuated program signal 113 is applied to an amplifier 114 and output 116.

As further shown in FIG. 2 a dc bias M for example +5 vdc is applied to the reference input 91 of D/A converter 81 and to reference input 111 and outputs 93 of D/A converter 81 and output 112 of D/A converter 101 where a variable resistor VR1 can be provided between the bias to outputs 92 and 112 and input 27 to prevent sound distortion when the variable resistor is set to balance inputs and outputs.

With reference to FIG. 3 which illustrates one example of a clock arrangement 60 to activate latch 53 it has been found that by actuation of program attenuation changes in "O" crossing of the program signal distortion of the output signal is substantially reduced. As shown in FIG. 3, where an amplifier 122 is provided to supply an AC square wave signal at output 124 from the program signal received from buss AP. Output 124 is supplied with B+ pullup I, for example +8 vdc and supplied through lead 126, 127 to the input to an Exclusive OR gate 123 where lead 127 includes a delay resistor R2. Thus as described in more detail in our copending application previously mentioned a pulse is provided to input 60A of latch 53 on "O" crossing of the program signal.

It will be recognized that the foregoing is but one example of an arrangement within the scope of the present invention and that various other arrangements within the scope of the present invention will occur to those skilled in the art upon reading the disclosure.

The invention claimed is:

1. A low impedance digital attenuator to selectively attenuate an alternating current composite program signal composed of output signals from a multiplicity of selectively actuated input channels in accordance with the number of actuated input channels including:
    (a) at least two input channels each including input channel control means each to provide first direct current actuating signals when the channel is in an actuated operating mode;
    (b) summing means to sum said first actuating signals from each input channel to provide a summed actuating signal in analog form;
    (c) analog to digital signal converter means to receive said summed actuating signal and provide a digital output actuating signal;
    (d) selectively programmed converter means to receive the digital output actuating signal and provide a digital control signal in response to the digital output actuating signal where the digital control signal is nonlinear with respect to the digital output signal;
    (e) first and second digital to analog converter means each including digital input means to receive the digital control signal and each including reference signal input means and signal output means where the first and second digital to analog converter means selectively attenuate the reference signal in response to the signal received at the digital input means where the reference signal input means of the first digital to analog converter means receives the composite program signal to provide an attenuated program signal from said digital to analog converter signal output means, reference signal source means to supply a selected reference signal to the second digital to analog converter reference input to provide an attenuated reference signal at said second digital to analog converter means output and summing means to combine said attenuated program signal and said attenuated reference signal to provide the selectively attenuated composite program signal.

2. The invention of claim 1 including latch means to receive said digital output signal and transmit said digital output signal to said converter means upon actuation of said latch means.

3. The invention of claim 2 including "O" crossing detector means to detect occurence of "O" voltage in said composite program signal and acutate said latch means to transmit said digital output actuating signal to said converter means.

4. The invention of claim 1 wherein the relationship between said digital output signal and said digital control signal provided by said converter means is logrithmic.

* * * * *